(12) United States Patent
Raab et al.

(10) Patent No.: US 12,372,877 B2
(45) Date of Patent: Jul. 29, 2025

(54) PROJECTION EXPOSURE APPARATUS FOR SEMICONDUCTOR LITHOGRAPHY

(71) Applicant: Carl Zeiss SMT GmbH, Oberkochen (DE)

(72) Inventors: Markus Raab, Schillingsfuerst (DE); Andreas Raba, Niederschoenenfeld (DE); Mirko Buechsenschuetz, Schweinfurt (DE); Matthias Manger, Aalen-Unterkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 210 days.

(21) Appl. No.: 18/339,592

(22) Filed: Jun. 22, 2023

(65) Prior Publication Data
US 2024/0012334 A1 Jan. 11, 2024

(30) Foreign Application Priority Data
Jul. 5, 2022 (DE) .......................... 102022116698.8

(51) Int. Cl.
*G03F 7/20* (2006.01)
*G02B 7/185* (2021.01)
*G03F 7/00* (2006.01)

(52) U.S. Cl.
CPC ......... *G03F 7/70316* (2013.01); *G02B 7/185* (2013.01); *G03F 7/70225* (2013.01)

(58) Field of Classification Search
CPC ............. G03F 7/70316; G03F 7/70225; G03F 7/70266; G02B 7/185; G02B 5/09; G02B 7/1827; G02B 7/198; G02B 26/0825; G02B 5/0891
See application file for complete search history.

(56) References Cited

U.S. PATENT DOCUMENTS

| | | |
|---|---|---|
| 6,573,978 B1 | 6/2003 | McGuire, Jr. |
| 2004/0202898 A1 | 10/2004 | Van Dijsseldonk et al. |
| 2006/0132747 A1 | 6/2006 | Singer et al. |
| 2010/0167189 A1* | 7/2010 | Del Puerto ............ G03B 27/68 430/30 |
| 2018/0074303 A1 | 3/2018 | Schwab |
| 2020/0073252 A1* | 3/2020 | Juergens ............. G03F 7/70825 |

FOREIGN PATENT DOCUMENTS

| | | |
|---|---|---|
| DE | 10 2008 009 600 A1 | 8/2009 |
| DE | 10 2017 220 586 A1 | 5/2019 |
| EP | 1 614 008 B1 | 12/2009 |

OTHER PUBLICATIONS

German Office Action, with translation thereof, for corresponding DE Appl No. 10 2022 116 698.8, dated Jan. 18, 2023.

* cited by examiner

*Primary Examiner* — Mesfin T Asfaw
(74) *Attorney, Agent, or Firm* — Fish & Richardson P.C.

(57) ABSTRACT

A projection exposure apparatus comprises an optical element. The optical element comprises a main body and an actuator for deforming an optically effective surface formed on the main body. The actuator is in a recess in the rear side of the main body.

20 Claims, 7 Drawing Sheets

PROJECTION EXPOSURE APPARATUS FOR SEMICONDUCTOR LITHOGRAPHY

CROSS-REFERENCE TO RELATED APPLICATIONS

This application claims benefit under 35 U.S.C. § 119 to German Application No. 10 2022 116 698.8, filed Jul. 5, 2022, the content of which is fully incorporated herein by reference herein.

FIELD

The disclosure relates to a projection exposure apparatus for semiconductor lithography.

BACKGROUND

In projection exposure apparatuses for semiconductor lithography, microscopically small structures are imaged, starting from a mask as the template, onto a wafer coated with photoresist at a greatly reduced size via photolithographic methods. In subsequent development and further processing steps, the desired structures, such as memory or logic elements, are created on the wafer, which is then divided into individual chips for use in electronic devices.

Owing to the very small structures to be created down to the nanometer range, the optical units of the projection exposure apparatuses, and thus the optical elements used, can be subject to extreme desired properties. Moreover, imaging aberrations that often stem from changing ambient conditions, such as temperature changes in the optical unit, regularly occur during the operation of a corresponding apparatus.

This issue is typically addressed by the optical elements used, such as lens elements or mirrors, being designed to be movable or deformable in order to enable the correction of the aforementioned imaging aberrations during the operation of the apparatus. Mechanical actuators which may be suitable, for example, for deforming the surface of an optical element used for imaging, that is to say what is known as the optically effective surface, in a targeted manner are generally used for this purpose. This deformation can be carried out from the rear side of a main body of the corresponding optical element. However, the desire to attach the relevant actuators in the region of the rear side of the main body entails further challenges, for example regarding installation space and also regarding ambient influences to which the actuators are exposed. The mechanical action of the actuators is typically enabled according to the certain known approaches by the actuators that are mechanically supported on a back plate in the rear region of the main body. However, the back plate itself likewise can cause further side effects that can have a detrimental effect on the construction and manufacturing complexity of the corresponding projection exposure apparatus.

One possibility for arranging actuators on the rear side of optical elements is described in US Patent 2004/0202898 A1. That specification describes a projection exposure apparatus in which actuators are arranged in recesses in a rear side of a main body of an optical element, with the actuators acting on the lateral surfaces of those recesses.

SUMMARY

The present disclosure seeks to provide a projection exposure apparatus for semiconductor lithography in which a simplified arrangement of actuators for mechanically manipulating optical elements is implemented.

A projection exposure apparatus according to an aspect of the disclosure comprises at least one optical element, wherein the optical element comprises a main body and at least one actuator for deforming an optically effective surface formed on the main body. The at least one actuator is arranged here in a recess in the rear side of the main body.

According to the disclosure, the effective direction of the actuator relative to the optically effective surface can run at least in part in the normal direction to the optically effective surface.

In one variant of the disclosure, the actuator can also be designed—independently of its effective direction—as a shear actuator.

The rear side of the main body is to be understood in this case to be the side that is furthest from the optically effective surface. So in accordance with a teaching of the disclosure, the actuator can be integrated in the main body rather than acting thereon through a support on a back plate that may be present. That means the actuator can be supported on the material of the main body and in this way exerts forces and moments thereon. The omission of a back plate brought about by this measure and the resulting freed-up installation space can enable the actuators to be arranged at a greater distance from the optically effective surface compared to a solution having a back plate. In this way it can be ensured that the actuators are not exposed to the thermal load of the optical element during operation to the extent as they would be in a solution having a back plate.

The design of the rear side of the main body moreover can offer the possibility of using standard actuators for example. Moreover, due to the fact that recesses are first created that are subsequently filled with the actuators, the dynamic of the optical element, that is, for example of a mirror, may not change too much.

It is furthermore possible to use the actuator bidirectionally, for example the actuator can be provided with a bias voltage so that, while the polarity is maintained, expansion or contraction can be achieved merely by way of the selection of the voltage. The actuators can be in the form of a disk or ring or of a frame or of a full-surface body. For example, piezoelectric, electrostrictive, magnetostrictive or photostrictive actuators may be used. The lack of a back plate here can enable the simple exchange of individual, possibly defective, actuators.

The installation tolerance generally depends only on the manufacturing quality of the individual recess and on the manufacturing tolerance (especially length tolerance) of the individual actuator to be placed in the respective recess. It is thus possible to measure the recesses and the actuators prior to installation and to determine the best combination of actuator and recess possible.

The actuator can be mechanically connected here to the main body such that it exerts its force over lateral boundary surfaces of the recess. The lateral boundary surfaces of the recess are understood here to mean for example surfaces which extend substantially normally to the optically effective surface of the optical element. In this case, both bending moments and forces in the normal direction to the optically effective surface can be introduced into the main body.

Bending moments can be introduced for example by the effective direction of the actuator being at least in part parallel to the optically effective surface. Forces in the normal direction to the optically effective surface can be introduced if the effective direction of the actuator relative to the optically effective surface extends at least in part in the normal direction to the optically effective surface.

Since in this case the forces exerted by the actuator act along the contact area between the actuator and the lateral boundary surface, this can help ensure a satisfactory transmission of force along the contact area without slip. This can be achieved for example by way of a material connection, meaning for example by using an adhesive. For example, one-component or multi-component adhesives can be used here, which can be activated upon mixing or by using UV light or by increased temperatures. The adhesive can be applied manually, can be supplied to the joining point via separate channels, can be applied in automated fashion or can be metered in. It is possible to fill the adhesive gap in the joint state by using capillary effects that "suck" the adhesive into the gap. Depending on the desired properties, the adhesive can be embodied in the form of a filled adhesive or can have further functionalities, such as electrical conductivity.

In general, it may be beneficial for both effective directions of the actuators to produce a connection that is as stable as possible. In addition to the aforementioned adhesives, the actuators can be fixed in the recesses for example also via mechanical loading (pressing connection), joining methods with material connections, such as adhesive/reactive bonding, soldering, welding or by optical contact bonding. However, it is also conceivable to achieve the transmission of force by way of a suitable, possibly form-fitting design of the surfaces involved.

The last-mentioned variant of the effective direction of the actuator normal to the optically effective surface can be implemented for example by the actuator being embodied in the form of a shear actuator. In this case, lateral boundary surfaces of the recess that lie opposite one another experience mutually opposed forces, and in this way local bending of the optically effective surface can be achieved.

With a suitable design of the recess and for example of its boundary, a situation can be created in which the at least one actuator is connected to the main body via a kinematic system arranged on the rear side of the main body. For example, the kinematic system can be formed in one piece with the main body. The kinematic system mentioned can be produced here by using the material adjacent to the recess. It is not absolutely necessary for the recess to have a simple shape, such as a cylindrical or rectangular shape. It is likewise possible for it to be produced in the manner of a grid for example by milling, with the result that a substantially grid-shaped structure is milled out and individual pillar-type regions of the main body material are left behind. Standard actuators, for example, which exert bending moments on the pillar-type regions can then be placed into the milled-out regions. The pillar-type regions thus represent individual levers of a kinematic system.

In an embodiment of the disclosure, at least two actuators are present which act on the lever from different sides; for example, four actuators which act on the lever from four different sides, in each case with an offset of 90°, may be present.

Owing to the fact that the lever has a notch between a point of application of the force of the actuator and the main body, it is possible by dimensioning the aforementioned notch in conjunction with the stiffness of the material used to set the extent to which a force applied by the actuator is introduced, for example as bending moment, into the main body.

This can be suitable, for example, for monolithic manufacturing of the main body with recesses.

By mechanically adapting the joint points between the actuators and the main body, a design can be found with which parasitic effects of the joint point are suppressed as much as possible, or with which the shape of the parasitic deformation can be influenced such that it is easily correctable. NCEs (non-correctable errors) due to changes in volume of the adhesive or changes in the mechanical loading state of the joint point can thus be efficiently suppressed.

If the adhesive exhibits expansion or shrinkage due to moisture and/or temperature, this has, in the case of an effective direction of the actuator perpendicular to the adhesive layer, the same deformation effect as an expansion of the actuator in the effective direction and is thus easily compensable.

If strain gradients that are caused by a change in global boundary conditions (change in ambient humidity, temperature offset of the components involved or of adjacent actuators) can occur via the adhesive in the longitudinal direction of the lever—that is to say in a normal direction to the optically effective surface—it is possible, for example in the case of symmetrical attachment of a plurality of actuators to a lever, to assume at least partial compensation.

Transverse deformations of the actuators, that is to say deformations in the longitudinal direction of the lever, can be effectively suppressed by the stiffness of the lever (shear stiffness and stiffness in the longitudinal direction). In order to further reduce parasitic effects from a deformation in the longitudinal direction of the lever, decoupling or other mechanical design adaptations may also be provided.

In embodiments, the disclosure can be easily combinable with a directly cooled optical element. The same is true for the combination with further temperature control devices. The temperature control devices may be implemented on the basis of radiation, for example by using infrared radiation, on the basis of resistive heating or in another manner.

BRIEF DESCRIPTION OF THE DRAWINGS

Exemplary embodiments and variants of the disclosure will be explained in more detail below with reference to the drawing, in which.

DETAILED DESCRIPTION

Figure 1:
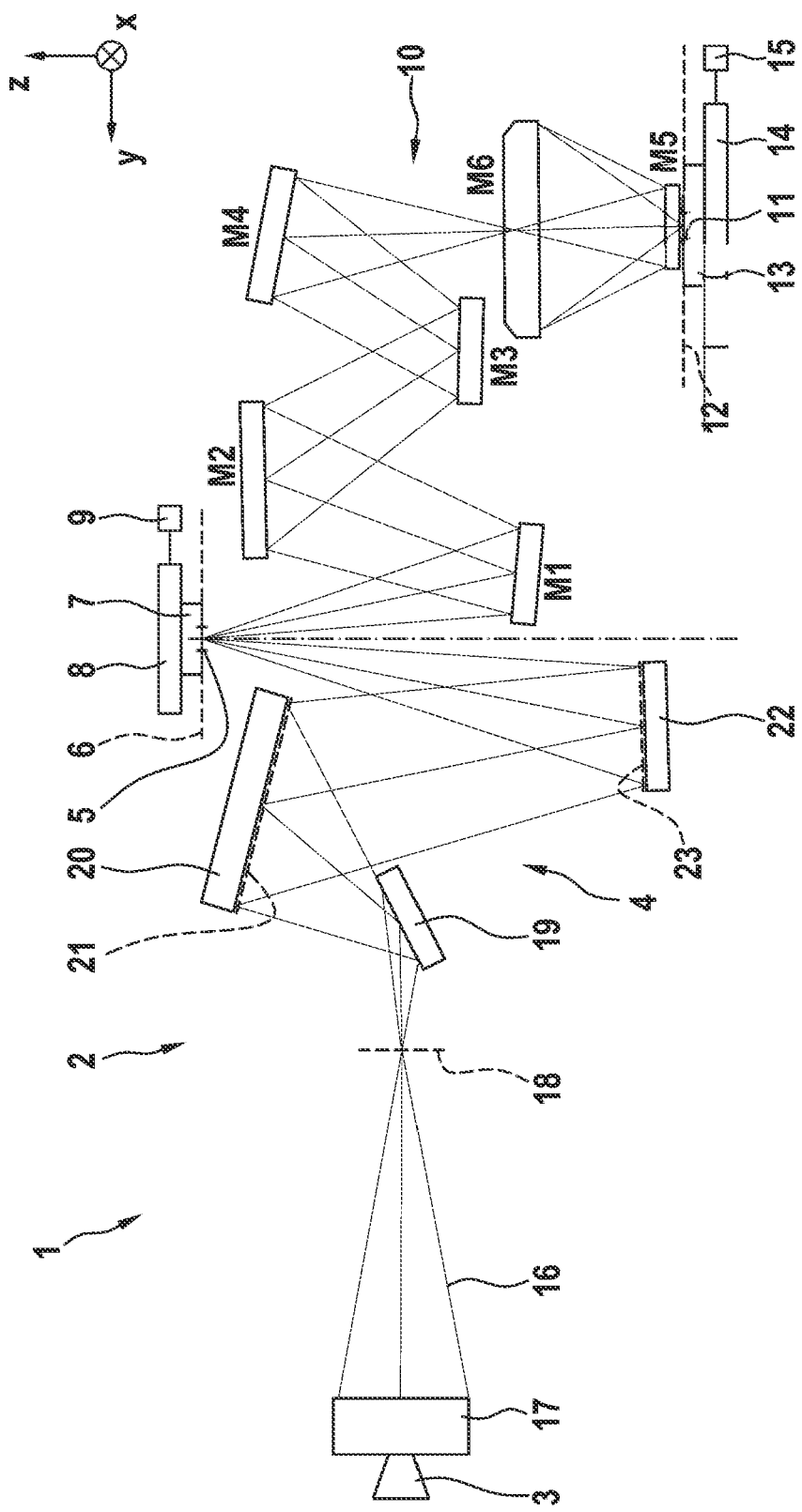
FIG. 1 schematically shows a meridional section of a projection exposure apparatus for EUV projection lithography, FIG. 2 schematically shows a meridional section of a projection exposure apparatus for DUV projection lithography.

Integral parts of a microlithographic projection exposure apparatus 1 are described in exemplary fashion below initially with reference to FIG. 1. The description of the fundamental construction of the projection exposure apparatus 1 and the integral parts thereof is understood here to be non-limiting.

An embodiment of an illumination system 2 of the projection exposure apparatus 1 has, in addition to a radiation source 3, an illumination optical unit 4 for illuminating an object field 5 in an object plane 6. In an alternative embodiment, the light source 3 may also be provided as a module separate from the rest of the illumination system. In this case, the illumination system does not comprise the light source 3.

A reticle 7 arranged in the object field 5 is illuminated. The reticle 7 is held by a reticle holder 8. The reticle holder 8 is displaceable, for example in a scanning direction, by way of a reticle displacement drive 9.

A Cartesian xyz-coordinate system is shown in FIG. 1 for explanation purposes. The x-direction runs perpendicular to the plane of the drawing into the latter. The y-direction runs horizontally, and the z-direction runs vertically. The scanning direction runs in the y-direction in FIG. 1. The z-direction runs perpendicular to the object plane 6.

The projection exposure apparatus 1 comprises a projection optical unit 10. The projection optical unit 10 serves for imaging the object field 5 into an image field 11 in an image plane 12. The image plane 12 extends parallel to the object plane 6. Alternatively, an angle that differs from 0° between the object plane 6 and the image plane 12 is also possible.

A structure on the reticle 7 is imaged onto a light-sensitive layer of a wafer 13 arranged in the region of the image field 11 in the image plane 12. The wafer 13 is held by a wafer holder 14. The wafer holder 14 is displaceable by way of a wafer displacement drive 15, for example longitudinally with respect to the y-direction. The displacement, firstly, of the reticle 7 by way of the reticle displacement drive 9 and, secondly, of the wafer 13 by way of the wafer displacement drive 15 can be implemented so as to be mutually synchronized.

The radiation source 3 is an EUV radiation source. The radiation source 3 emits, for example, EUV radiation 16, which is also referred to below as used radiation, illumination radiation or illumination light. For example, the used radiation has a wavelength in the range between 5 nm and 30 nm. The radiation source 3 can be a plasma source, for example an LPP (laser produced plasma) source or a GDPP (gas discharge produced plasma) source. It may also be a synchrotron-based radiation source. The radiation source 3 may be a free electron laser (FEL).

The illumination radiation 16 emerging from the radiation source 3 is focused by a collector 17. The collector 17 may be a collector with one or more ellipsoidal and/or hyperboloidal reflection surfaces. The illumination radiation 16 can be incident on the at least one reflection surface of the collector 17 with grazing incidence (GI), which is to say at angles of incidence of greater than 45° relative to the direction of the normal to the mirror surface, or with normal incidence (NI), which is to say at angles of incidence of less than 45°. The collector 17 can be structured and/or coated firstly for optimizing its reflectivity for the used radiation and secondly for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a redirection mirror 19 and, arranged downstream thereof in the beam path, a first facet mirror 20. The redirection mirror 19 may be a plane redirection mirror or, alternatively, a mirror with a beam-influencing effect going beyond a pure redirection effect. Alternatively or in addition, the redirection mirror 19 may be embodied in the form of a spectral filter that separates a used light wavelength of the illumination radiation 16 from extraneous light of a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. FIG. 1 depicts only some of the facets 21 by way of example.

The first facets 21 can be embodied in the form of macroscopic facets, for example in the form of rectangular facets or in the form of facets with an arcuate peripheral contour or a peripheral contour of part of a circle. The first facets 21 may be embodied as plane facets or alternatively as convexly or concavely curved facets.

As known for example from DE 10 2008 009 600 A1, the first facets 21 themselves can also be composed in each case of a multiplicity of individual mirrors, for example a multiplicity of micromirrors. For example, the first facet mirror 20 can be embodied as a microelectromechanical system (MEMS system). For details, reference is made to DE 10 2008 009 600 A1.

The illumination radiation 16 travels horizontally, that is to say longitudinally with respect to the y-direction, between the collector 17 and the redirection mirror 19.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1, and U.S. Pat. No. 6,573,978.

The second facet mirror 22 comprises a plurality of second facets 23. In the case of a pupil facet mirror, the second facets 23 are also referred to as pupil facets.

The second facets 23 may likewise be macroscopic facets, which may for example have a round, rectangular or hexagonal periphery, or may alternatively be facets composed of micromirrors. In this regard, reference is likewise made to DE 10 2008 009 600 A1.

The second facets 23 can have plane or, alternatively, convexly or concavely curved reflection surfaces.

The illumination optical unit 4 consequently forms a doubly faceted system. This principle is also referred to as a fly's eye condenser (fly's eye integrator).

It can be desirable to arrange the second facet mirror 22 not exactly in a plane that is optically conjugate to a pupil plane of the projection optical unit 10. For example, the pupil facet mirror 22 can be arranged so as to be tilted relative to a pupil plane of the projection optical unit 10, as is described, for example, in DE 10 2017 220 586 A1.

The individual first facets 21 are imaged into the object field 5 with the aid of the second facet mirror 22. The second facet mirror 22 is the last beam-shaping mirror or indeed the last mirror for the illumination radiation 16 in the beam path upstream of the object field 5.

In a further embodiment (not shown) of the illumination optical unit 4, a transfer optical unit contributing for example to the imaging of the first facets 21 into the object field 5 may be arranged in the beam path between the second facet mirror 22 and the object field 5. The transfer optical unit can comprise exactly one mirror or, alternatively, two or more mirrors, which are arranged in succession in the beam path of the illumination optical unit 4. The transfer optical unit may for example comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the redirection mirror 19, the field facet mirror 20, and the pupil facet mirror 22.

The redirection mirror 19 can also be dispensed with in a further embodiment of the illumination optical unit 4, and so the illumination optical unit 4 can then have exactly two mirrors downstream of the collector 17, specifically the first facet mirror 20 and the second facet mirror 22.

The imaging of the first facets 21 into the object plane 6 via the second facets 23 or using the second facets 23 and a transfer optical unit is, as a rule, only approximate imaging.

The projection optical unit 10 comprises a plurality of mirrors Mi, which are consecutively numbered in accordance with their arrangement in the beam path of the projection exposure apparatus 1.

In the example illustrated in FIG. 1, the projection optical unit 10 comprises six mirrors M1 to M6. Alternatives with four, eight, ten, twelve or any other number of mirrors Mi are likewise possible. The penultimate mirror M5 and the last mirror M6 each have a passage opening for the illumination radiation 16. The projection optical unit 10 is a doubly obscured optical unit. The projection optical unit 10 has an image-side numerical aperture which is greater than 0.5 and which can also be greater than 0.6 and, for example, can be 0.7 or 0.75.

Reflection surfaces of the mirrors Mi can be embodied as freeform surfaces without an axis of rotational symmetry. Alternatively, the reflection surfaces of the mirrors Mi can be designed as aspherical surfaces with exactly one axis of rotational symmetry of the reflection surface shape. Just like the mirrors of the illumination optical unit 4, the mirrors Mi can have highly reflective coatings for the illumination radiation 16. These coatings can be designed as multilayer coatings, for example with alternating layers of molybdenum and silicon.

The projection optical unit 10 has a large object-image offset in the y-direction between a y-coordinate of a center of the object field 5 and a y-coordinate of the center of the image field 11. In the y-direction, this object-image offset can be of approximately the same magnitude as a z-distance between the object plane 6 and the image plane 12.

For example, the projection optical unit 10 can have an anamorphic embodiment. For example, it has different imaging scales βx, βy in the x- and y-directions. The two imaging scales βx, βy of the projection optical unit 10 can be (βx, βy)=(+/−0.25, +/−0.125). A positive imaging scale β means imaging without image inversion. A negative sign for the imaging scale β means imaging with image inversion.

The projection optical unit 10 consequently leads to a reduction in size with a ratio of 4:1 in the x-direction, which is to say in a direction perpendicular to the scanning direction.

The projection optical unit 10 leads to a reduction in size of 8:1 in the y-direction, which is to say in the scanning direction.

Other imaging scales are likewise possible. Imaging scales with the same signs and the same absolute values in the x-direction and y-direction are also possible, for example with absolute values of 0.125 or 0.25.

The number of intermediate image planes in the x-direction and in the y-direction in the beam path between the object field 5 and the image field 11 can be the same or can differ depending on the embodiment of the projection optical unit 10. Examples of projection optical units with different numbers of such intermediate images in the x- and y-directions are known from US 2018/0074303 A1.

In each case one of the pupil facets 23 is assigned to exactly one of the field facets 21 for forming in each case an illumination channel for illuminating the object field 5. For example, this can yield illumination according to the Köhler principle. The far field is decomposed into a multiplicity of object fields 5 with the aid of the field facets 21. The field facets 21 generate a plurality of images of the intermediate focus on the pupil facets 23 respectively assigned thereto.

The field facets 21 are imaged, in each case by way of an assigned pupil facet 23, onto the reticle 7 in a manner such that they are superposed on one another for the purposes of illuminating the object field 5. The illumination of the object field 5 is for example as homogeneous as possible. It can have a uniformity error of less than 2%. The field uniformity can be achieved by overlaying different illumination channels.

The illumination of the entrance pupil of the projection optical unit 10 can be defined geometrically by way of an arrangement of the pupil facets. The intensity distribution in the entrance pupil of the projection optical unit 10 can be set via the selection of the illumination channels, for example the subset of the pupil facets which guide light. This intensity distribution is also referred to as illumination setting.

A likewise pupil uniformity in the region of sections of an illumination pupil of the illumination optical unit 4 that are illuminated in a defined manner can be achieved by a redistribution of the illumination channels.

Further aspects and details of the illumination of the object field 5 and for example of the entrance pupil of the projection optical unit 10 are described below.

The projection optical unit 10 may for example have a homocentric entrance pupil. The latter can be accessible. It can also be inaccessible.

The entrance pupil of the projection optical unit 10 cannot, as a rule, be exactly illuminated using the pupil facet mirror 22. The aperture rays often do not intersect at a single point when imaging the projection optical unit 10 which telecentrically images the center of the pupil facet mirror 22 onto the wafer 13. However, it is possible to find an area in which the spacing of the aperture rays that is determined in pairs becomes minimal. This area represents the entrance pupil or an area in real space that is conjugate thereto. For example, this area has a finite curvature.

It may be the case that the projection optical unit 10 has different poses of the entrance pupil for the tangential beam path and for the sagittal beam path. In this case, an imaging element, for example an optical component part of the transfer optical unit, should be provided between the second facet mirror 22 and the reticle 7. With the aid of this optical element, the different poses of the tangential entrance pupil and the sagittal entrance pupil can be taken into account.

In the arrangement of the components of the illumination optical unit 4 illustrated in FIG. 1, the pupil facet mirror 22 is arranged in an area conjugate to the entrance pupil of the projection optical unit 10. The field facet mirror 20 is arranged so as to be tilted with respect to the object plane 6.

The first facet mirror 20 is arranged so as to be tilted with respect to an arrangement plane defined by the redirection mirror 19.

The first facet mirror 20 is arranged so as to be tilted with respect to an arrangement plane defined by the second facet mirror 22.

Figure 2:
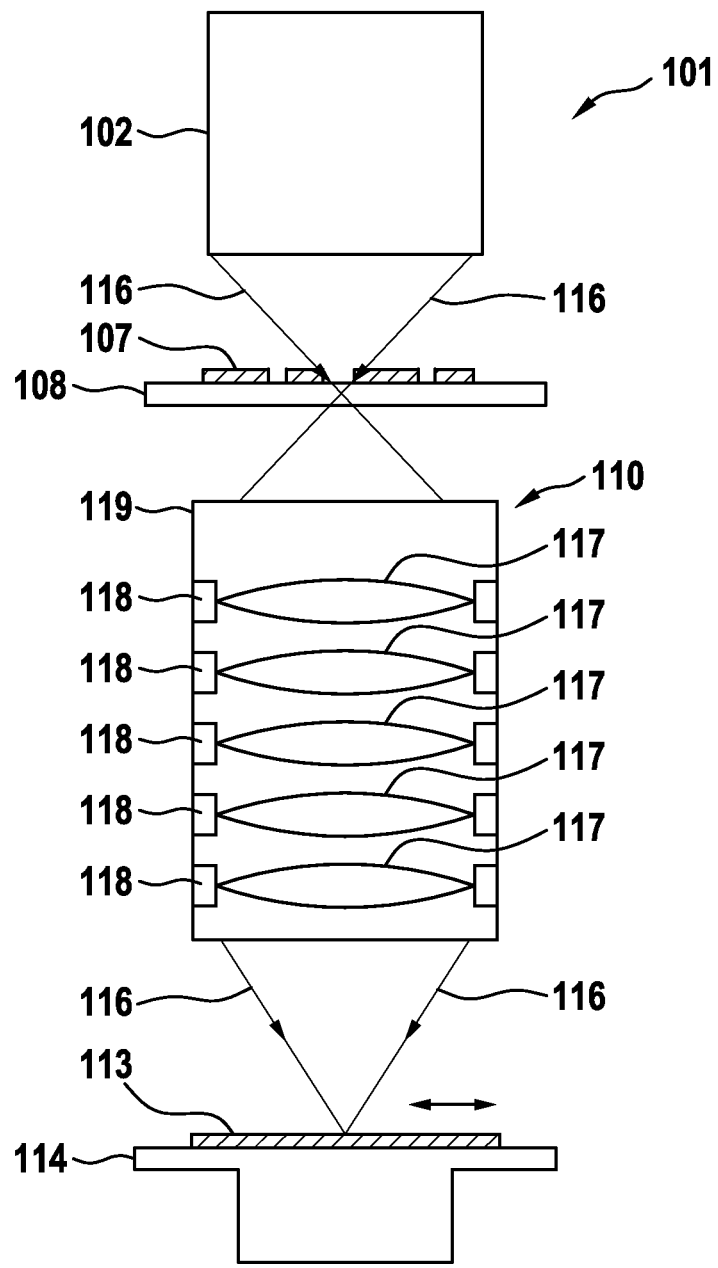

FIG. 2 schematically shows a meridional section of a further projection exposure apparatus 101 for DUV projection lithography, in which the disclosure can likewise be used.

The construction of the projection exposure apparatus 101 and the principle of the imaging are comparable with the construction and procedure described in FIG. 1. Identical component parts are denoted by a reference sign increased by 100 relative to FIG. 1, which is to say the reference signs in FIG. 2 begin with 101.

In contrast to an EUV projection exposure apparatus 1 as described in FIG. 1, refractive, diffractive and/or reflective optical elements 117, such as for example lens elements, mirrors, prisms, terminating plates, and the like, can be used for imaging or for illumination in the DUV projection exposure apparatus 101 on account of the greater wavelength of the DUV radiation 116, employed as used light, in the range from 100 nm to 300 nm, for example of 193 nm. The projection exposure apparatus 101 in this case can comprise an illumination system 102, a reticle holder 108 for receiving and exactly positioning a reticle 107 provided with a structure, by which the later structures on a wafer 113 are determined, a wafer holder 114 for holding, moving, and exactly positioning the wafer 113, and a projection lens 110, with a plurality of optical elements 117, which are held by way of mounts 118 in a lens housing 119 of the projection lens 110.

The illumination system 102 provides DUV radiation 116 for imaging the reticle 107 on the wafer 113. A laser, a plasma source or the like can be used as the source of this radiation 116. The radiation 116 is shaped in the illumination system 102 via optical elements such that the DUV radiation 116 has the desired properties with regard to diameter, polarization, shape of the wavefront and the like when it is incident on the reticle 107.

Apart from the additional use of refractive optical elements 117, such as lens elements, prisms, terminating plates, the construction of the downstream projection optical unit 110 with the lens housing 119 does not differ in principle from the construction described in FIG. 1 and is therefore not described in further detail.

Figure 3A:
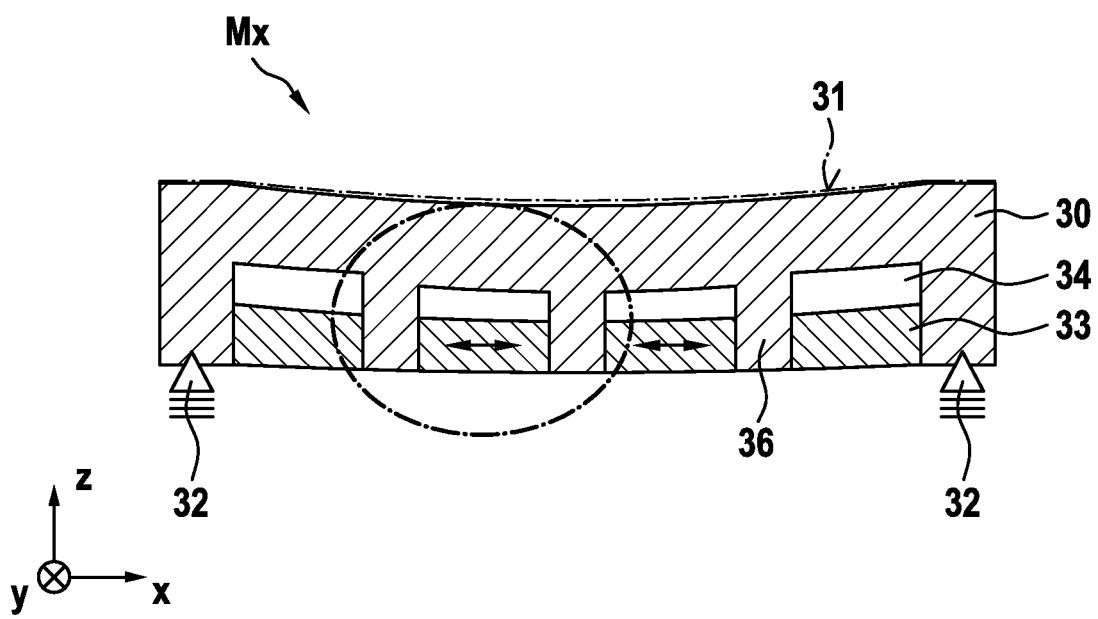
FIGS. 3A-B show a first embodiment of the disclosure.

FIG. 3A shows a first embodiment of the disclosure, in which an optical element, which is depicted as a mirror Mx and can be used in one of the projection exposure apparatuses that have been explained with reference to FIG. 1 and FIG. 2, is illustrated. The mirror Mx comprises a main body 30 having an optically effective surface 31, wherein the main body 30 is supported on a support 32. The main body 30 furthermore comprises a kinematic system which is implemented in the example shown as a lever 36 which is formed by recesses 34 in the main body 30. Between two levers 36 of this configuration, each case one actuator 33 is arranged parallel to the optically effective surface 31, wherein the effective direction of the actuator 33 is likewise parallel to the optically effective surface 31. The actuator 33 can be embodied as a solid-state actuator, for example as a piezoelectric or electrostrictive actuator. The actuators 33 are controlled by a controller (not shown) and deflect the levers 36, as a result of which the moment generated by the lever 36 causes a deformation in the optically effective surface 31. Alternatively, the levers 36 can be produced separately and can be subsequently connected to the main body 30.

Figure 3B:
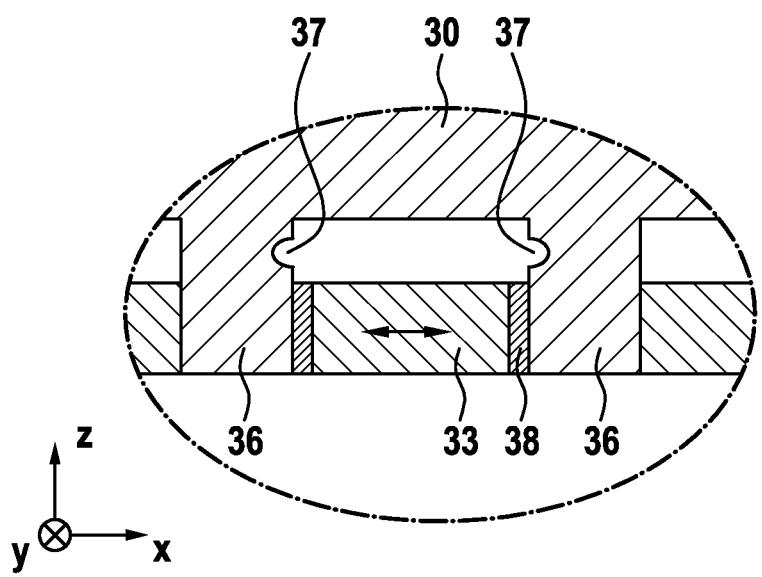

FIG. 3B shows a detailed view of a variant of the embodiment of the disclosure explained in FIG. 3A, with the levers 36 comprising a notch 37 in this variant. The notch 37 reduces the stiffness of the attachment of the lever 36 to the main body 30, as a result of which the transferred moment and the resulting deformation of the optically effective surface 31 can be set. In the embodiment illustrated in FIG. 3B, the actuator 33 is connected to the levers 36 using an adhesive 38. Alternatively, the actuator 33 can also be shrunk in by the preload between the levers 36. The lever can furthermore comprise a wide variety of geometries for decoupling the forces transferred to the optically effective surface by the actuator and/or the joint point.

Figure 4A:
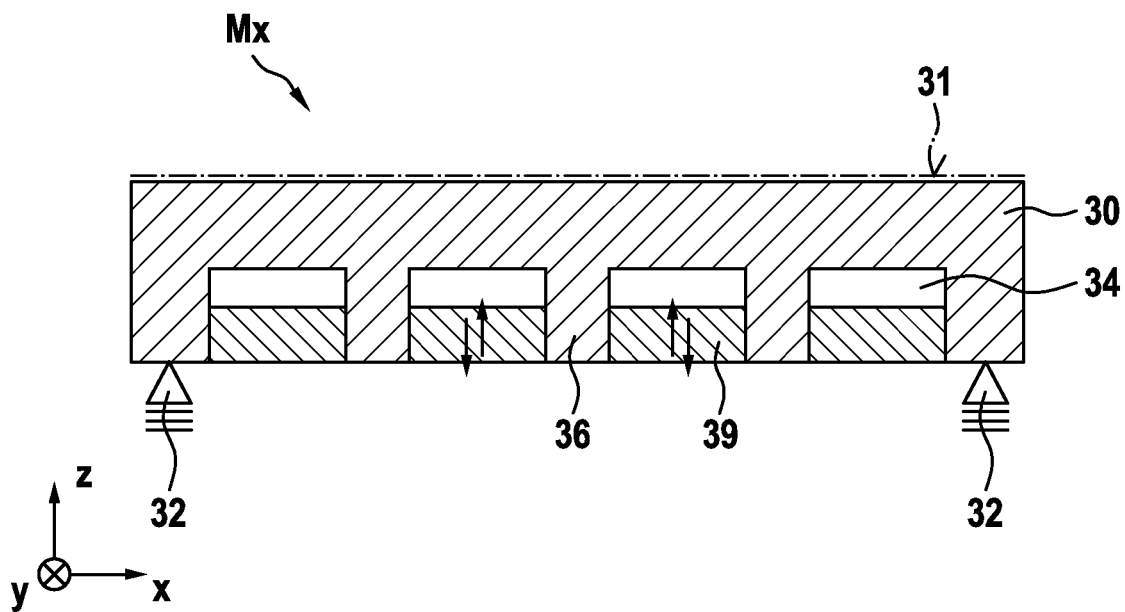
FIGS. 4A-B show a further embodiment of the disclosure.
Figure 4B:
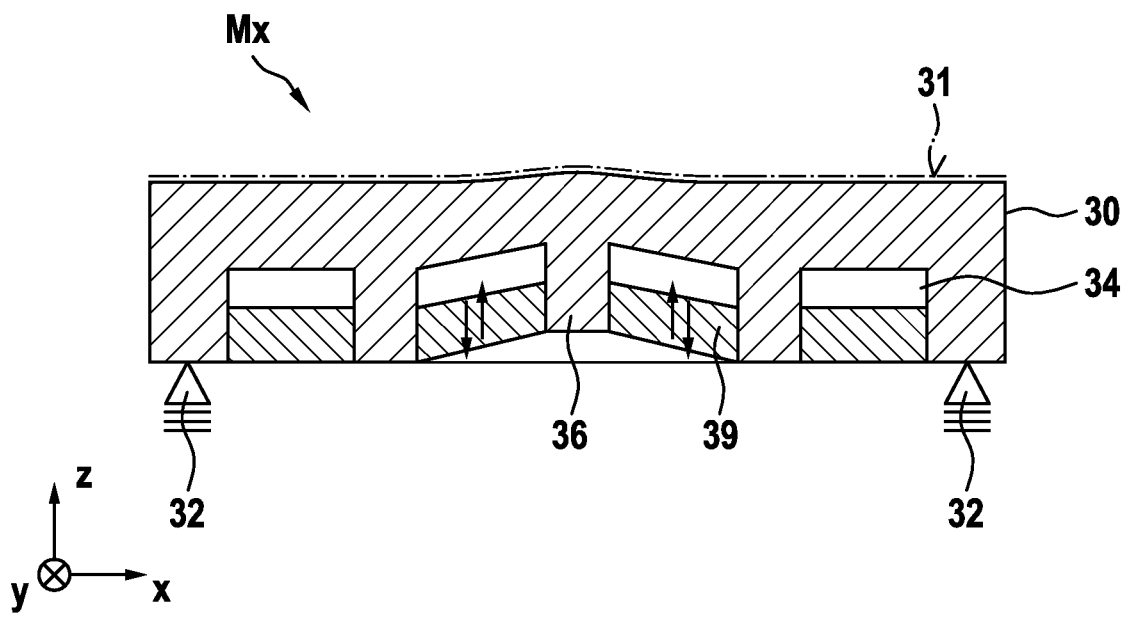

FIG. 4A and FIG. 4B show a further embodiment of the disclosure in two different operating states, in which an optical element, which is in each case depicted as a mirror Mx and can be used in one of the projection exposure apparatuses that have been explained with reference to FIG. 1 and FIG. 2, is illustrated. The mirror Mx comprises a main body 30 having an optically effective surface 31 and also a kinematic system having levers 36 produced by way of recesses 34 in the main body 30 and shear actuators 39. The shear actuators 39 are oriented in their longitudinal orientations parallel to the optically effective surface 31, but perform a shear movement directed perpendicular to the optically effective surface 31 when a voltage is applied, due to the interconnection of the electrodes or due to the internal construction of the actuator and the actuator material used. In other words, the levers act on the main body 30 in the direction of a surface normal to the optically effective surface 31 and deform the latter.

FIG. 4A shows what is known as a zero state, in which the optically effective surface 31 of the main body 30 has no deformations, that is to say corresponds to its predetermined surface shape. The shear actuators 39 are deflected from a voltage-less zero position, as a result of which the main body 30 is deformed from its zero position in a direction depending on the voltage applied. The optically effective surface 31 can be processed to completion before the actuators 39 are installed. It can be likewise desirable for specific actuators to use a medium voltage (BIAS voltage).

FIG. 4B shows a deflected operating state in which a lever 36 is shown deflected by two shear actuators 39 connected to the lever 36. The deflection of the lever 36 results in a deformation of the optically effective surface 31. The same actuators would bring about a concave deformation in the optically effective surface 31, rather than the convex deformation shown in FIG. 4B, if controlled with an opposite voltage.

In general, there is also the possibility of supplementing the shear actuators 39 shown in the figure with conventional actuators which could for example be used to compensate a change in dimension perpendicular to the shear. Moreover, this offers the possibility of combining the deformations caused by the different actuation principles (long-range and short-range) to correct imaging aberrations of a projection exposure apparatus.

Figure 5A:
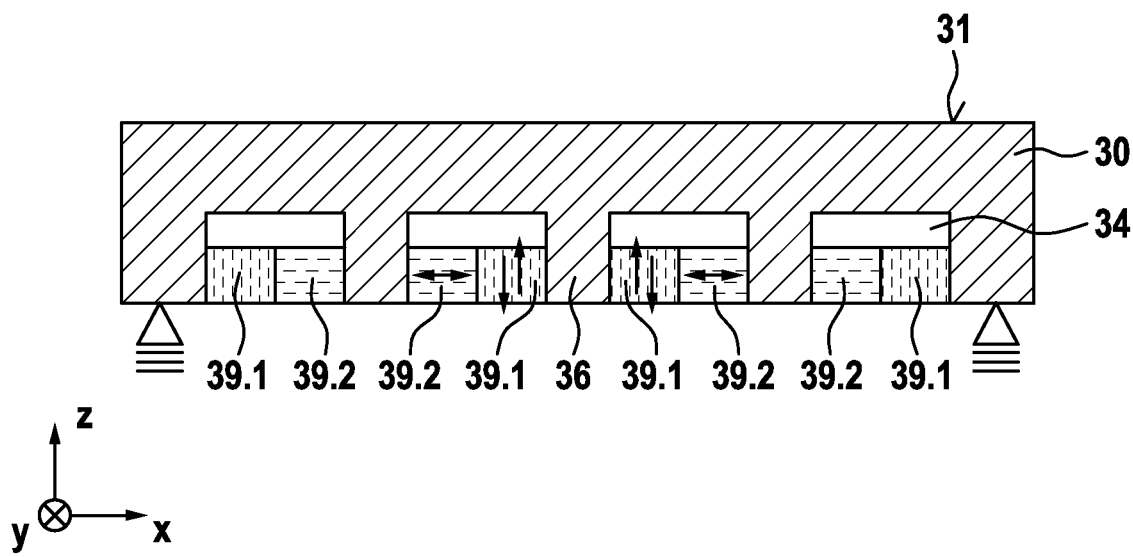
FIG. 5A shows a variant for compensating transverse contractions of shear actuators.
Figure 5B:
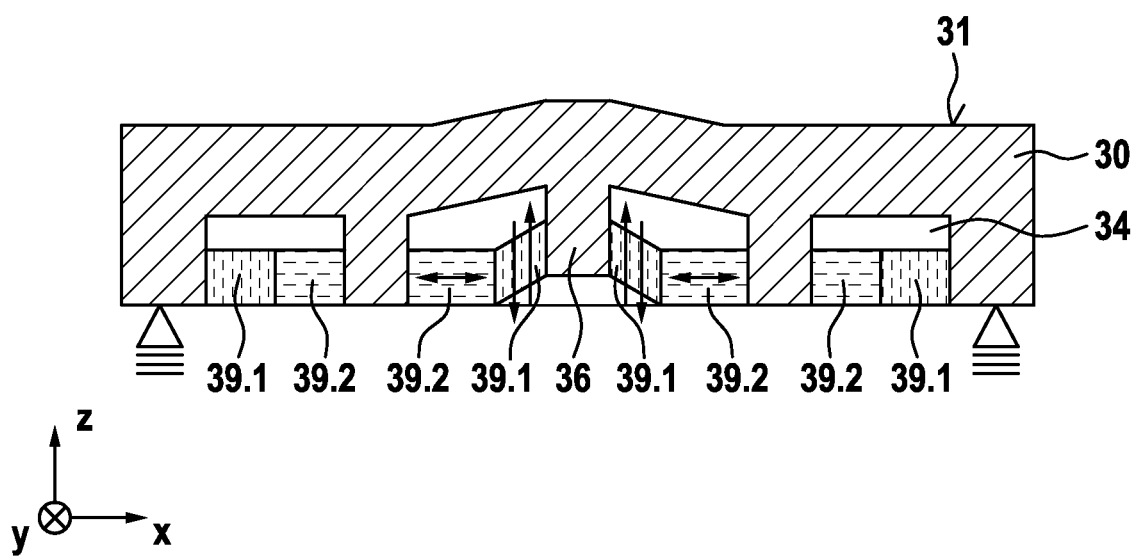
FIG. 5B shows the variant shown in FIG. 5a in the deflected state.

A corresponding variant of the disclosure is shown in FIGS. 5A and 5B. In deviation from the variant shown in FIG. 4A, the embodiment of FIGS. 5A and 5B show in each case two mechanically interconnected actuators 39.1 and 39.2 in the recesses 34. These actuators 39.1 are shear actuators, whereas the actuators 39.2 are conventional actuators. If the shear actuators 39.1 are controlled in the y-direction and thereby deflected, the shear actuators 39.1 contract in the x-direction. This contraction, which is illustrated in slightly exaggerated fashion in FIG. 5B for illustrative purposes, is then compensated for by an appropriately selected deflection of the conventional actuators 39.2 in a manner such that there are no forces acting on the levers 39, parallel to the optically effective surface 31.

Figure 6A:
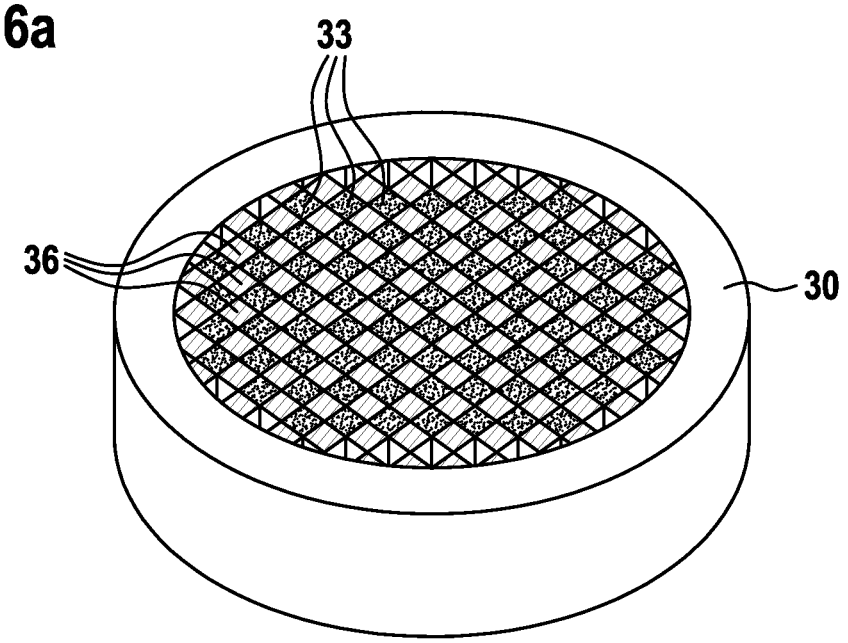
FIG. 6A shows an easily producible variant of the disclosure.

FIG. 6A shows a variant of the disclosure in which the recesses are created by a grid that has been milled into the rear side of a main body. The grid structure is here produced by grooves extending in the manner of a cross being milled into the rear side of the main body 30. In this way, parts of the material of the main body in the manner of levers remain behind. Standard actuators 33 can then be placed between these levers, as is shown in FIG. 5A. This variant is distinguished by it being very simple to produce.

Figure 6B:
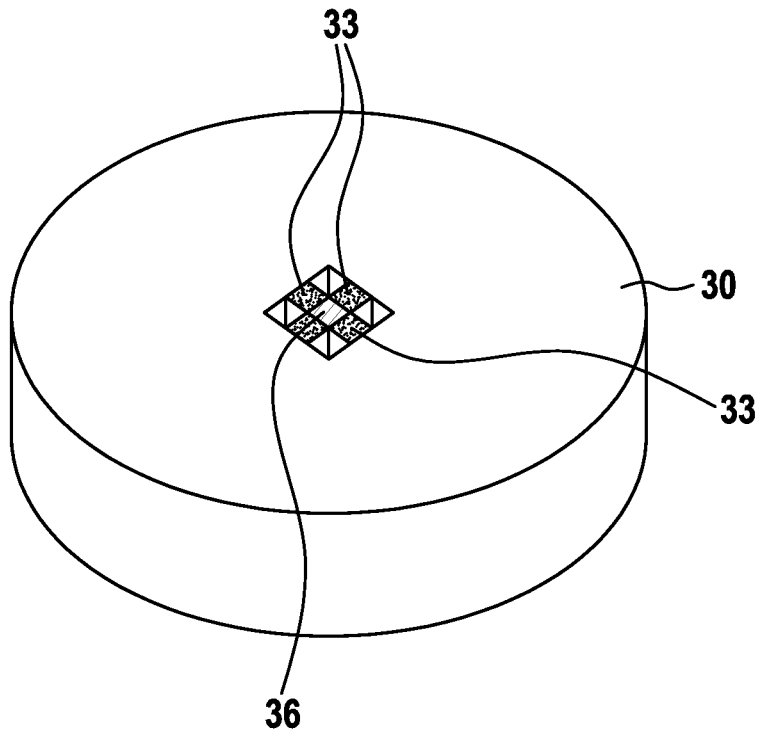
FIG. 6B shows a modification of the solution shown in FIG. 6A.

It is likewise conceivable, as illustrated using FIG. 6B, to introduce an individual, frame-type recess into a rear side of a main body 30 such that again an individual lever 36 remains behind at the center of the recess, which lever is surrounded in the example shown by four standard actuators 33.

Figure 6C:
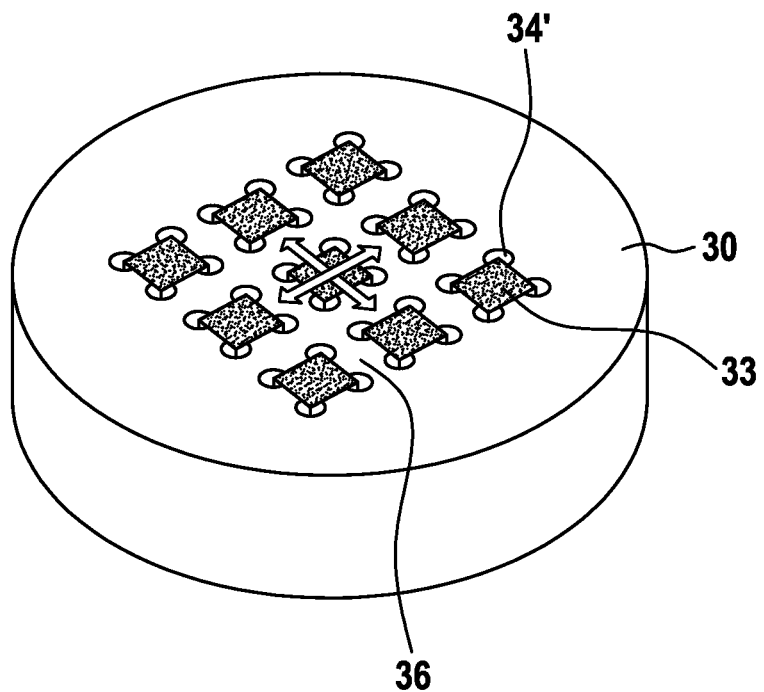
FIG. 6C shows a further modification of the solution shown in FIG. 6a, and FIG. 6D shows an embodiment of the disclosure with decoupling in the region of an adhesive layer.

FIG. 6C shows a further variant of the disclosure in which the recesses 34' are designed such that an actuator 33 having a rectangular, in the example having a square, cross section can be inserted in the recesses. For this purpose, the recesses 34' are adapted regarding their cross section to the shape of an actuator 33 having a rectangular cross section, with the result that the side faces of the actuator 33 partially rest against the walls of the recesses 34'; for example, the side faces of the actuator 33 can in these regions be adhesively bonded to the walls. However, in the region of the longitudinal edges of the actuator 33, that is to say in the region of the corners of the cross section of the actuator 33, the recesses 34' are provided with further cutouts, with the result that the actuators 33 are connected to the material of the main body 30 only by the central regions of their outer surfaces. It is then possible in conjunction with the regular arrangement of a plurality of actuators 33 as shown in FIG. 6C for lever-type kinematic systems 36 to be likewise implemented in the region between the actuators 33. In the example shown, the actuators are actuable in two mutually perpendicular directions, as indicated by the arrows which are not denoted separately in the figure. It is likewise conceivable to use actuators having cross sections that deviate therefrom, for example having hexagonal or octagonal cross sections and correspondingly further degrees of freedom of actuation.

Figure 6D:
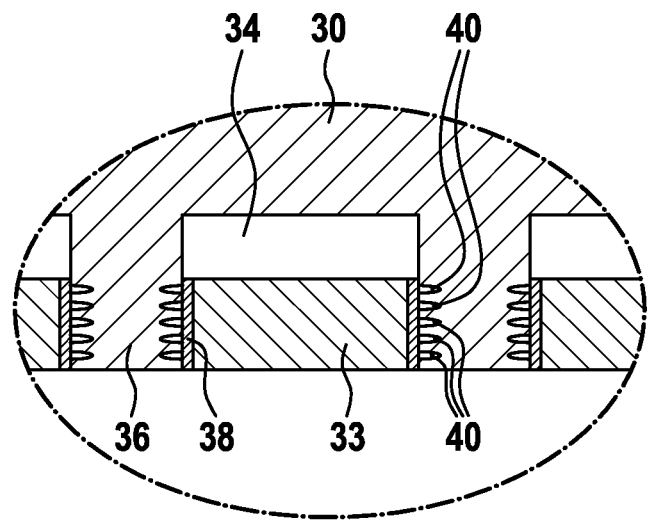

FIG. 6D shows a variant of the disclosure in which the levers 36 are designed such that undesirable effects, for example due to a change in volume of the joint point, are suppressed. In the example shown, an enlarged detail of a cut in the region of an actuator 33 is shown. Here, levers 36 are connected to actuators 33 via an adhesive 38. The levers 36 are provided with decoupling cuts 40 in the region of the adhesive 38. The decoupling cuts 40 have the effect that changes in volume of the adhesive 38 do not propagate, or only to a reduced extent, in the longitudinal direction of the lever 36, that is to say in the direction of the optically effective surface of the associated optical element.

LIST OF REFERENCE SIGNS

1 Projection exposure apparatus
2 Illumination system
3 Radiation source
4 Illumination optical unit
5 Object field
6 Object plane
7 Reticle
8 Reticle holder
9 Reticle displacement drive
10 Projection optical unit
11 Image field
12 image plane
13 Wafer
14 Wafer holder
15 Wafer displacement drive
16 EUV radiation
17 Collector
18 Intermediate focal plane
19 Redirection mirror
20 Facet mirror
21 Facets
22 Facet mirror
23 Facets
30 Main body
31 Optically effective surface
32 Support
33 Actuator
34,34' Recess
36 Kinematic system, lever
37 Notch
38 Adhesive
39 Shear actuator
40 Decoupling cut
101 Projection exposure apparatus
102 Illumination system
107 Reticle
108 Reticle holder
110 Projection optical unit
113 Wafer
114 Wafer holder
116 DUV radiation
117 Optical element
118 Mounts
119 Lens housing
M1-M6 Mirrors

What is claimed is:

1. An apparatus, comprising:
    an optical element, comprising:
        a main body; and
        an actuator configured to deform an optically effective surface supported by the main body,
    wherein:
        the actuator is in a recess in a rear side of the main body;
        the actuator is mechanically connected to the main body and configured to exerts its force over lateral boundary surfaces of the recess;
        relative to the optically effective surface, an effective direction of the actuator runs at least in part in a normal direction to the optically effective surface; and
        the apparatus is a projection exposure apparatus.

2. The apparatus of claim 1, wherein the actuator comprises a shear actuator.

3. The apparatus of claim 1, further comprising a kinematic system on the rear side of the main body, wherein the kinematic system connects the actuator to the main body.

4. The apparatus of claim 3, wherein the kinematic system is one piece with the main body.

5. The apparatus of claim 3, wherein the kinematic system comprises a lever.

6. The apparatus of claim 5, comprising at least two actuators configured to act on the lever from different sides.

7. The apparatus of claim 5, comprising four actuators configured to act on the lever from four different sides, in each case with an offset of 90°.

8. The apparatus of claim 5, wherein the lever comprises a notch between a point of application of the force of the actuator and the main body.

9. The apparatus of claim 5, wherein the actuator comprises a shear actuator.

10. The apparatus of claim 3, wherein the actuator comprises a shear actuator.

11. The apparatus of claim 1, comprising an illumination system and a projection optical unit.

12. The apparatus of claim 1, wherein the optical element comprises a reflection surface.

13. An apparatus, comprising:
an optical element, comprising:
a main body; and
a shear actuator configured to deform an optically effective surface supported by the main body,
wherein:
the shear actuator is in a recess in a rear side of the main body;
the shear actuator is mechanically connected to the main body and configured to exerts its force over lateral boundary surfaces of the recess;
the apparatus is a projection exposure apparatus.

14. The apparatus of claim 13, wherein an effective direction of the shear actuator runs at least in part parallel to the optically effective surface.

15. The apparatus of claim 13, further comprising a kinematic system on the rear side of the main body, wherein kinematic system connects the shear actuator to the main body.

16. The apparatus of claim 15, wherein the kinematic system is one piece with the main body.

17. The apparatus of claim 15, wherein the kinematic system comprises a lever.

18. The apparatus of claim 17, comprising at least two actuators configured to act on the lever from different sides.

19. The apparatus of claim 17, comprising four actuators configured to act on the lever from four different sides, in each case with an offset of 90°.

20. The apparatus of claim 17, wherein the lever comprises a notch between a point of application of the force of the actuator and the main body.

* * * * *